US010656525B2

(12) United States Patent
Chen et al.

(10) Patent No.: US 10,656,525 B2
(45) Date of Patent: May 19, 2020

(54) PHOTORESIST BAKING APPARATUS

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Chung-jen Chen, Guangdong (CN); Ming-wen Lin, Guangdong (CN); Yan-ze Li, Guangdong (CN); Chilin Wu, Guangdong (CN); Zhikun Wu, Guangdong (CN)

(73) Assignee: SHENZHEN CHINA STAR OPTOELECTRONICS SEMICONDUCTOR DISPLAY TECHNOLOGY CO., LTD., Shenzhen (CA)

( * ) Notice: Subject to any disclaimer, the term of this patent is extended or adjusted under 35 U.S.C. 154(b) by 102 days.

(21) Appl. No.: 16/025,235

(22) Filed: Jul. 2, 2018

(65) Prior Publication Data
US 2019/0072852 A1 Mar. 7, 2019

Related U.S. Application Data

(63) Continuation of application No. PCT/CN2017/107512, filed on Oct. 24, 2017.

(30) Foreign Application Priority Data

Sep. 1, 2017 (CN) .......................... 2017 1 0779911

(51) Int. Cl.
*G03F 7/16* (2006.01)
*B05D 3/04* (2006.01)
*B05D 3/02* (2006.01)

(52) U.S. Cl.
CPC ........... *G03F 7/168* (2013.01); *B05D 3/0272* (2013.01); *B05D 3/0473* (2013.01); *B05D 3/0413* (2013.01)

(58) Field of Classification Search
CPC ..... G03F 7/168; B05D 3/0272; B05D 3/0473; B05D 3/413
(Continued)

(56) References Cited

U.S. PATENT DOCUMENTS 4,794,021 A * 12/1988 Potter ..................... G03F 7/168
427/240
5,766,824 A * 6/1998 Batchelder .............. G03F 7/168
134/21
(Continued)

FOREIGN PATENT DOCUMENTS

JP 4870837 B2 * 2/2012 ................ F26B 3/00
WO WO-2008143476 A1 * 11/2008 ....... H01L 21/02057

*Primary Examiner* — Stephen M Gravini
(74) *Attorney, Agent, or Firm* — Hemisphere Law, PLLC; Zhigang Ma

(57) ABSTRACT

A photoresist baking apparatus is provided. The photoresist baking apparatus comprises a baking chamber including an inlet, an outlet and a cover sealed connected thereon. The cover is applied to guide the hot air entering the baking chamber and includes a heating device for maintaining the temperature of the hot air. The heating device is disposed on the cover for heating the hot air flowing to the cover and maintaining the temperature of the hot air to be consistent when the hot air flowing to the outlet, thereby to prevent from the photoresist volatile condensing and dripping due to decreased temperature after the photoresist volatile contacting the cover and affecting the product quality, and to guarantee the temperature homogeneity inside the baking chamber.

7 Claims, 2 Drawing Sheets

(58) Field of Classification Search
USPC .......................................................... 34/231
See application file for complete search history.

(56) References Cited

U.S. PATENT DOCUMENTS

| | | | | |
|---|---|---|---|---|
| 6,032,382 | A * | 3/2000 | Matsumoto | ....... H01L 21/67034 34/78 |
| 6,312,518 | B1 * | 11/2001 | Kwon | ...................... G03F 7/168 118/52 |
| 7,581,335 | B2 * | 9/2009 | Tanaka | .............. H01L 21/67028 118/900 |
| 8,393,091 | B2 * | 3/2013 | Kawamoto | ....... H01L 21/02057 134/21 |
| 8,793,898 | B2 * | 8/2014 | Jeong | ................ H01L 21/02057 34/351 |
| 2019/0072852 | A1 * | 3/2019 | Chen | ........................ G03F 7/168 |
| 2019/0317408 | A1 * | 10/2019 | Goo | ........................ G03F 7/168 |

\* cited by examiner

PHOTORESIST BAKING APPARATUS

RELATED APPLICATIONS

This application is a continuation application of PCT Patent Application No. PCT/CN2017/107512, filed Oct. 24, 2017, which claims the priority benefit of Chinese Patent Application No. 201710779911.2, filed Sep. 1, 2017, which is herein incorporated by reference in its entirety.

FIELD OF THE DISCLOSURE

The disclosure relates to a liquid crystal display technical field, and more particularly to a photoresist baking apparatus.

BACKGROUND

Liquid crystal displays are widely applied for fabricating cell phones, PDAs, digital cameras, etc., due to numerous advantages such as thin bodies, energy saving and radiation-free. In the current process for fabricating the liquid crystal panel, it is required to coat a photoresist layer, expose the photoresist layer, and then develop the photoresist pattern for forming a film. After coating the photoresist, it is necessary to extract a portion of solvent of the photoresist by a vacuum unit, and then to perform drying and curing by a baking apparatus, to remove the residual solvent of the photoresist after the vacuum drying, for increasing the adhesion between the photoresist and the substrate to obtain a better development effect.

In the heating process of the baking apparatus, the main ways to heat the substrate is using hot air or infrared radiation. The temperature inside the baking chamber of the baking apparatus is about 90-120 degrees, for heating and curing the photoresist and volatilizing the solvent in the photoresist at the same time. When using the hot air for heating, the hot air entering the baking chamber would be affected by the environment inside the baking chamber, thereby to cause the baking chamber having two different temperatures, the temperature dose to the inlet is higher than that close to the outlet. The photoresist volatile would condense and drip on the substrate due to decreased temperature thereby to contaminate the substrate.

SUMMARY

For overcoming the deficiency of the current technology, the present invention provides a photoresist baking apparatus for reducing the temperature difference in the baking chamber, to prevent from the volatile condensing and dripping on the substrate due to decreased temperature and affecting the product quality.

The present invention provides a photoresist baking apparatus. The photoresist baking apparatus comprises a baking chamber including an inlet, an outlet and a cover sealed connected thereon. The cover is applied to guide the hot air entering the baking chamber and includes a heating device for maintaining a temperature of the hot air.

In one embodiment, the heating device is a resistance coil disposed on the cover.

In one embodiment, the heating device is a positive temperature coefficient (PTC) heating plate.

In one embodiment, the heating device is disposed on one side of the cover close to the outlet.

In one embodiment, the heating device is disposed on one surface of the cover far away the baking chamber.

In one embodiment, the inlet and the outlet are disposed separately on two opposite sides of the baking chamber.

In one embodiment, the baking chamber includes a first diversion channel disposed on the inlet inside the baking chamber for guiding the hot air flowing to the cover, wherein the first diversion channel includes an import sealed connected to the inlet and an export facing the cover.

In one embodiment, the baking chamber includes a second diversion channel disposed on the outlet inside the baking chamber for recycling the hot air, wherein the second diversion channel includes an import facing the cover and an export sealed connected to the outlet.

In one embodiment, the photoresist baking apparatus further comprises a heat recycling device connected to the outlet through a pipe.

In one embodiment, the photoresist baking apparatus further comprises a hot air generating device connected to the inlet through a pipe.

Compared to the current technology, a heating device is disposed on the cover in the present invention, for heating the hot air flowing to the cover and maintaining the temperature of the hot air to be consistent when the hot air flowing to the outlet, thereby to prevent from the photoresist volatile condensing and dripping due to decreased temperature after the photoresist volatile contacting the cover and affecting the product quality, and to guarantee the temperature homogeneity inside the baking chamber.

DETAILED DESCRIPTION OF PREFERRED EMBODIMENTS

The accompanying drawings and the following embodiments are combined for further illustrating the present invention.

Figure 1:
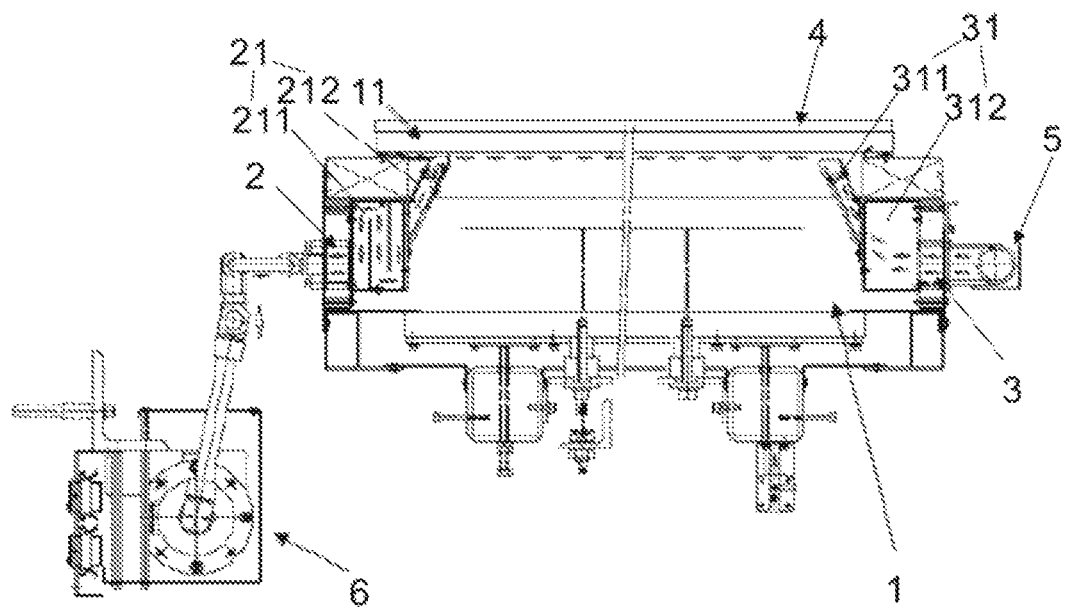
FIG. 1 is a structure view of the photoresist baking apparatus in the present invention.

As shown in FIG. 1, the present invention provides a photoresist baking apparatus comprising a baking chamber 1. The size of the baking chamber 1 is determined according to the actual situation and not limited herein. The baking chamber 1 includes a cover 11 disposed thereon. The cover 11 is sealed connected to the baking chamber 1. The baking chamber 1 includes an inlet 2 and an outlet 3 disposed thereon. The inlet 2 is connected to the hot air generating device 6 through a pipe, thereby to inject the hot air generated by the hot air generating device 6 into the baking chamber 1. The outlet 3 is connected to the exhausting device 5 through a pipe. It is noted that the hot air generating device 6 and the exhausting device 5 both are regular components of the baking apparatus and are not limited herein. The inlet 2 and the outlet 3 are disposed separately on two opposite sides of the baking chamber 1. The baking chamber 1 includes a first diversion channel 21 disposed on the inlet 2 inside the baking chamber 1 for guiding the hot air flowing to the cover 11. The first diversion channel 21 includes an import sealed connected to the inlet 2 and an export facing the cover 11. The baking chamber 1 includes a second diversion channel 31 disposed on the outlet 3 inside the baking chamber 1 for recycling the hot air. The second diversion channel 31 includes an import facing the cover 11 and an export sealed connected to the outlet 3.

In the present invention, the cover 11 is applied to guide the hot air to flow from one side of the cover 11 close to the first diversion channel 21 toward another side of the cover 11 close to the second diversion channel 31 for maintaining the temperature inside the baking chamber 1.

In the present invention, the cover 11 includes a heating device 4 for maintaining the temperature of the hot air. The temperature would be changed during the path of hot air flowing to the second diversion channel 31, and this change would cause the photoresist volatile condensing and dripping due to the decreased temperature to contaminate the substrate. The heating device 4 disposed on the cover 11 can maintain the temperature of the hot air to be consistent for improving the temperature homogeneity between two sides of the first diversion channel 21 and the second diversion channel 31.

Figure 2:
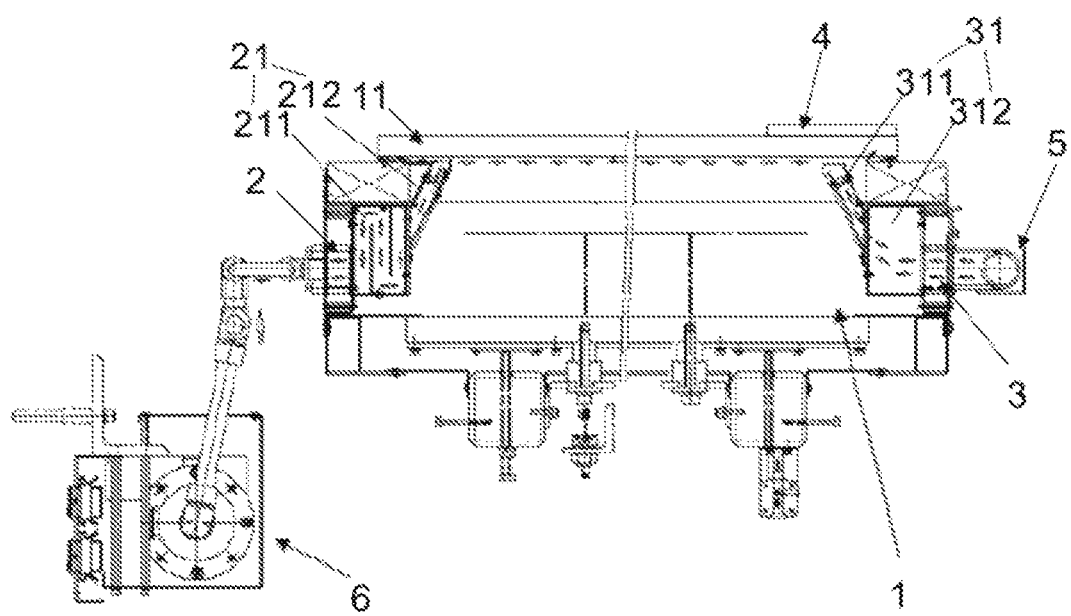
FIG. 2 is a structure view illustrating the position for disposing the heating device in the present invention.

In one embodiment of the present invention, as shown in FIG. 2, the heating device 4 is disposed at one side of the cover 11 close to the outlet 3, for heating the side with lower temperature, to maintain the temperature of hot air at one side of the baking chamber 1 close to the inlet 2 same as the temperature of hot air at another side of the baking chamber 1 close to the inlet 3, thereby to reduce the area required to be heated and to decrease the energy consumption.

For guaranteeing the heating effect, the cover 11 may be made of thermal material with good thermal effect, such as metal or ceramics, and the material of the cover 11 is not limited herein.

As shown in FIG. 1, the first diversion channel 21 includes a S-shaped channel 211 and a first extending channel 212 disposed inclined. One end of the S-shaped channel 211 is connected to a lowest point of the first extending channel 212, and another end of the S-shaped channel 211 is connected to the inlet 2. A highest point of the first extending channel 212 is facing the cover 11.

The second diversion channel 31 includes an inclined disposed second extending channel 311 and a through cavity 312. A lowest point of the second extending channel 311 is connected to one end of the through cavity 312, and another end of the through cavity 312 is communicated to the outlet 3. A highest point of the second extending channel 311 is facing the cover 11.

Figure 3:
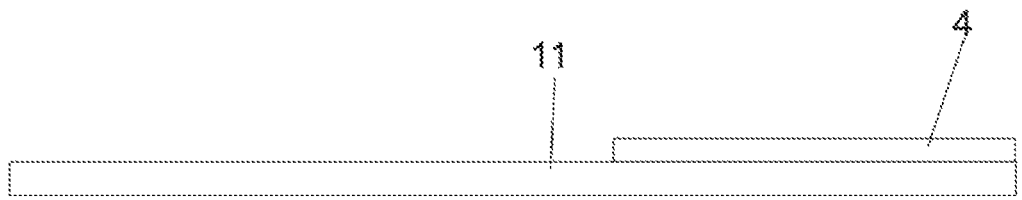
FIG. 3 is a structure view illustrating a first scheme of disposing the heating device in the present invention.

As shown in FIG. 3, the heating device 4 is disposed on one surface of the cover 11 far away the baking chamber 1 and close to the outlet 3. This kind of heating method can perform heat conduction through the cover 11 to achieving the heating effect. However, the present invention is not limited to the method depicted herein. For example, the heating device 4 could be disposed directly on one surface of the cover 11 facing the baking chamber 1.

Figure 4:
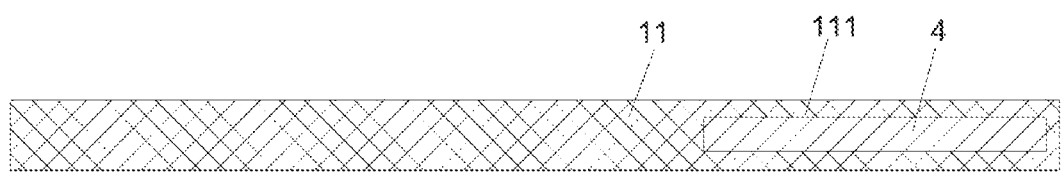
FIG. 4 is a structure view illustrating a second scheme of disposing the heating device in the present invention.

As shown in FIG. 4, the cover 11 includes a hollow chamber 111, and the heating device 4 is disposed in the hollow chamber 111 and close to the position of the outlet 3. This kind of design can promote the heating effect and prevent the heating device 4 from contacting the photoresist volatile.

In the present invention, the heating device 4 is a resistance coil disposed on the cover 11. The resistance coil is distributed evenly on the cover 11 or in the hollow chamber 111, to have the heating temperature more even. In specific, the resistance coil is snake-shaped or spiral-shaped. Of course, the heating device 4 may be also formed of a positive temperature coefficient (PTC) heating plate.

The present invention can control and maintain the temperature at a high degree effectively, thereby to prevent from the photoresist volatile condensing and dripping due to decreased temperature and affecting the product. The temperature homogeneity of the cover of the baking chamber can be improved effectively, to heat evenly two sides of the outlet and the inlet, for effectively improving the temperature difference of the baking chamber in the prior art and improving the stability and homogeneity of processing substrates.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A photoresist baking apparatus comprising:
a baking chamber, including an inlet, an outlet and a cover sealed connected thereon, wherein the cover is applied to guide a hot air entering the baking chamber and includes a heating device disposed thereon for maintaining a temperature of the hot air,
wherein the inlet and the outlet are disposed separately on two opposite sides of the baking chamber,
wherein the baking chamber includes a first diversion channel disposed on the inlet inside the baking chamber for guiding the hot air flowing to the cover, wherein the first diversion channel includes an import sealed connected to the inlet and an export facing the cover, and
wherein the baking chamber includes a second diversion channel disposed on the outlet inside the baking chamber for recycling the hot air, wherein the second diversion channel includes an import facing the cover and an export sealed connected to the outlet.

2. The photoresist baking apparatus according to claim 1, wherein the heating device is a resistance coil disposed on the cover.

3. The photoresist baking apparatus according to claim 1, wherein the heating device is a positive temperature coefficient (PTC) heating plate.

4. The photoresist baking apparatus according to claim 1, wherein the heating device is disposed on one side of the cover close to the outlet.

5. The photoresist baking apparatus according to claim 4, wherein the heating device is disposed on one surface of the cover away from the baking chamber.

6. The photoresist baking apparatus according to claim 1, further comprising an exhausting device connected to the outlet through a pipe.

7. The photoresist baking apparatus according to claim 6, further comprising a hot air generating device connected to the inlet through a pipe.

\* \* \* \* \*